(12) United States Patent
Lee

(10) Patent No.: US 10,333,481 B2
(45) Date of Patent: Jun. 25, 2019

(54) AMPLIFICATION APPARATUS HAVING SINGLE-INPUT MULTI-OUTPUT STRUCTURE

(71) Applicant: SOLiD, INC., Seongnam-si, Gyeonggi-do (KR)

(72) Inventor: Hwansun Lee, Bucheon-si (KR)

(73) Assignee: SOLiD, INC., Seongnam-si (KR)

( * ) Notice: Subject to any disclaimer, the term of this patent is extended or adjusted under 35 U.S.C. 154(b) by 43 days.

(21) Appl. No.: 15/538,529

(22) PCT Filed: Dec. 21, 2015

(86) PCT No.: PCT/KR2015/014051
§ 371 (c)(1),
(2) Date: Sep. 5, 2017

(87) PCT Pub. No.: WO2016/105060
PCT Pub. Date: Jun. 30, 2017

(65) Prior Publication Data
US 2017/0366150 A1    Dec. 21, 2017

(30) Foreign Application Priority Data
Dec. 22, 2014 (KR) .................. 10-2014-0186414

(51) Int. Cl.
*H03G 3/30* (2006.01)
*H03F 3/68* (2006.01)
(Continued)

(52) U.S. Cl.
CPC ......... *H03G 3/3036* (2013.01); *H03F 1/3247* (2013.01); *H03F 3/189* (2013.01);
(Continued)

(58) Field of Classification Search
CPC .................................................. H03G 3/3036
See application file for complete search history.

(56) References Cited

U.S. PATENT DOCUMENTS

| | | | |
|---|---|---|---|
| 6,020,783 A * | 2/2000 | Coppola | H03D 7/161 327/552 |
| 7,091,778 B2 * | 8/2006 | Gan | H03F 1/0211 330/124 R |

(Continued)

FOREIGN PATENT DOCUMENTS

| | | |
|---|---|---|
| KR | 20-0389952 Y1 | 7/2005 |
| KR | 10-0744952 B1 | 8/2007 |
| KR | 10-1131910 B1 | 4/2012 |

OTHER PUBLICATIONS

Notice to Submit Response for KR 10-2016-7010547 dated Nov. 29, 2016.

(Continued)

*Primary Examiner* — Patricia T Nguyen
(74) *Attorney, Agent, or Firm* — Sughrue Mion, PLLC

(57) ABSTRACT

According to one mode of the inventive concept, an amplification device includes a first amplifier configured to amplify an input multi-band signal to a first level, a separating unit configured to separate the multi-band signal having the first level into a first band signal and a second band signal, and a second amplifier configured to amplify the second band signal to a second level.

15 Claims, 7 Drawing Sheets

(51) Int. Cl.
*H03F 3/189* (2006.01)
*H03F 1/32* (2006.01)

(52) U.S. Cl.
CPC ............ *H03F 3/68* (2013.01); *H03G 3/3052*
(2013.01); *H03F 2200/111* (2013.01); *H03F 2200/171* (2013.01); *H03F 2200/411* (2013.01); *H03F 2200/429* (2013.01)

(56) References Cited

U.S. PATENT DOCUMENTS

| | | | | |
|---|---|---|---|---|
| 8,345,716 | B1* | 1/2013 | Ehret ....................... | H04B 7/10 370/334 |
| 2004/0209584 | A1* | 10/2004 | Bargroff ................... | H03D 7/00 455/180.1 |
| 2006/0273255 | A1* | 12/2006 | Volkov .................... | G01S 7/024 250/336.1 |
| 2015/0236738 | A1* | 8/2015 | Kan ........................ | H04B 1/123 370/318 |
| 2017/0338781 | A1* | 11/2017 | Lyalin ................... | H03F 1/0288 |

OTHER PUBLICATIONS

International Search Report for PCT/KR2015/014051 dated Apr. 28, 2016.

* cited by examiner

AMPLIFICATION APPARATUS HAVING SINGLE-INPUT MULTI-OUTPUT STRUCTURE

CROSS-REFERENCE TO RELATED APPLICATIONS

This application is a National Stage of International Application No. PCT/KR2015/014051, filed Dec. 21, 2015, and claims priority from Korean Patent Application No. 10-2014-0186414, filed Dec. 22, 2014, the contents of which are incorporated herein by reference in their entireties.

BACKGROUND

1. Field

The inventive concept relates to an amplification device, and more particularly, to an amplification device having a single-input multi-output structure.

2. Description of the Related Art

A distributed antenna system (or a wireless repeater) fundamentally functions to cover a shadow area which a signal from a base station is difficult to reach. For instance, a distributed antenna system is installed in an area, such as an inside or a basement of a building, a subway, a tunnel, or a residential apartment block, where signals are not received or are weakly received and amplifies and transmits radio frequency (RF) signals from a base station to terminals, thereby extending a coverage of the base station.

With the recent increasing demand for multi-band or multi-operator in a mobile communication system, a distributed antenna system has been designed and manufactured to support a service such as multi-band or multi-operator.

When a distributed antenna system support a multi-band service, a high power amplifier is required for each band, which leads to an increase of the size and the price of equipment of the distributed antenna system.

In addition, as bands supported by a distributed antenna system are various from 1 GHz or less to 1 GHz or greater, amplifiers with different gains are required, which leads to limitations on unified design, management and operation for multiple bands in the distributed antenna system.

SUMMARY

The inventive concept provides an amplification device for allowing the manufacturing cost and the size of equipment to be decreased and for allowing amplifiers with different gains for multi-band signals to be efficiently managed and operated.

According to an aspect of the inventive concept, there is provided an amplification device includes a first amplifier configured to amplify an input multi-band signal to a first level; a separating unit configured to separate the multi-band signal having the first level into a first band signal and a second band signal; and a second amplifier configured to amplify the second band signal to a second level.

According to an exemplary embodiment, the first level may be set according to an output condition for the first band signal and the second level may be set according to an output condition for the second band signal.

According to an exemplary embodiment, the separating unit may include a coupler configured to split the multi-band signal having the first level into a first multi-band split signal and a second multi-band split signal; a first filter configured to filter the first multi-band split signal to output the first band signal; and a second filter configured to filter the second multi-band split signal to output the second band signal.

According to an exemplary embodiment, the separating unit may include a power divider configured to split the multi-band signal having the first level into a first multi-band split signal having a third level and a second multi-band split signal having a fourth level; a first filter configured to filter the first multi-band split signal having the third level to output the first band signal; and a second filter configured to filter the second multi-band split signal having the fourth level to output the second band signal.

According to an exemplary embodiment, the third level may be set according to an output condition for the first band signal.

According to an exemplary embodiment, the separating unit may include a diplexer configured to separate the multi-band signal having the first level into the first band signal and the second band signal.

According to an exemplary embodiment, the amplification device may further include a receiving unit configured to receive a raw multi-band signal and to output the multi-band signal, wherein the receiving unit may divide the raw multi-band signal into a first raw band signal and a second raw band signal, attenuate the first and second raw band signals, and combine attenuated first and second raw band signals to output the multi-band signal.

According to an exemplary embodiment, the amplification device may further include a linearizer configured to linearize the second band signal, wherein the second amplifier may amplify, to the second level, the second band signal that has been linearized by the linearizer.

According to an exemplary embodiment, the amplification device may further include an isolator configured to be located between the first amplifier and the separating unit to block an inflow of a signal from the separating unit to the first amplifier.

According to an exemplary embodiment, the first band signal may be in a lower frequency band than the second band signal.

According to an exemplary embodiment, the first level may be lower than the second level.

According to another aspect of the inventive concept, there is provided an amplification device includes a first amplifier configured to amplify an input multi-band signal to a first level; a splitting unit configured to split the multi-band signal having the first level into a first multi-band split signal and a second multi-band split signal; and a second amplifier configured to amplify the second multi-band split signal to a second level.

According to an exemplary embodiment, the first level may be set according to an output condition for a first band signal comprised in the first multi-band split signal and the second level may be set according to an output condition for a second band signal comprised in the second multi-band split signal.

According to an exemplary embodiment, the splitting unit may include a coupler configured to split the multi-band signal having the first level into the first multi-band split signal and the second multi-band split signal.

According to an exemplary embodiment, the splitting unit may include a power divider configured to split the multi-band signal having the first level into the first multi-band split signal and the second multi-band split signal so that the first multi-band split signal has a third level and the second multi-band split signal has a fourth level.

According to an exemplary embodiment, the third level may be set according to an output condition for a first band signal comprised in the first multi-band split signal.

According to embodiments of the inventive concept, an amplification device amplifies a multi-band signal to meet output requirements, using an amplifier having a lower gain than a usual high gain amplifier, so that the manufacturing cost and the size of equipment can be decreased.

In addition, the amplification device allows amplifiers having different gains for multi-band signals to be efficiently managed and operated.

BRIEF DESCRIPTION OF THE FIGURES

The drawings referred to in the detailed description set forth below will be briefly described.

DETAILED DESCRIPTION OF EXEMPLARY EMBODIMENTS

The inventive concept may include various modifications and different embodiments. The detailed description will be set forth with reference to the drawings showing specific embodiments. However, embodiments of the inventive concept will not be restricted to the specifically disclosed features described below but will include any modifications, equivalents, or substitutes that do not depart from the scope of the inventive concept.

In the description of the inventive concept, when the detailed description for the known technology in the related art may blur the gist of the inventive concept, the detailed description will be omitted. Although terms such as first, second and the like may be used in the description of the embodiments, these terms are only used to distinguish one element from another. It will be understood that when an element is referred to as being "connected" or "coupled" to another element, it can be directly connected or coupled to the other element or intervening elements may be present unless otherwise defined. As used herein, terminology such as "part (or unit)", "~or", "~er", and "module" may indicate a unit which processes at least one function or operation and may be implemented by hardware, software, or a combination thereof.

It should be clearly understood that elements are just defined by their main functions. In detail, two or more elements may be integrated into one element or one element may be divided into two or more elements by their subdivided functions. Each of the elements which will be described below may partially or fully perform the function of another element in addition to its own main function and part of the main function of each element may be exclusively performed by another element.

Hereinafter, embodiments of the inventive concept will be described in detail with reference to the attached drawings.

Figure 1:
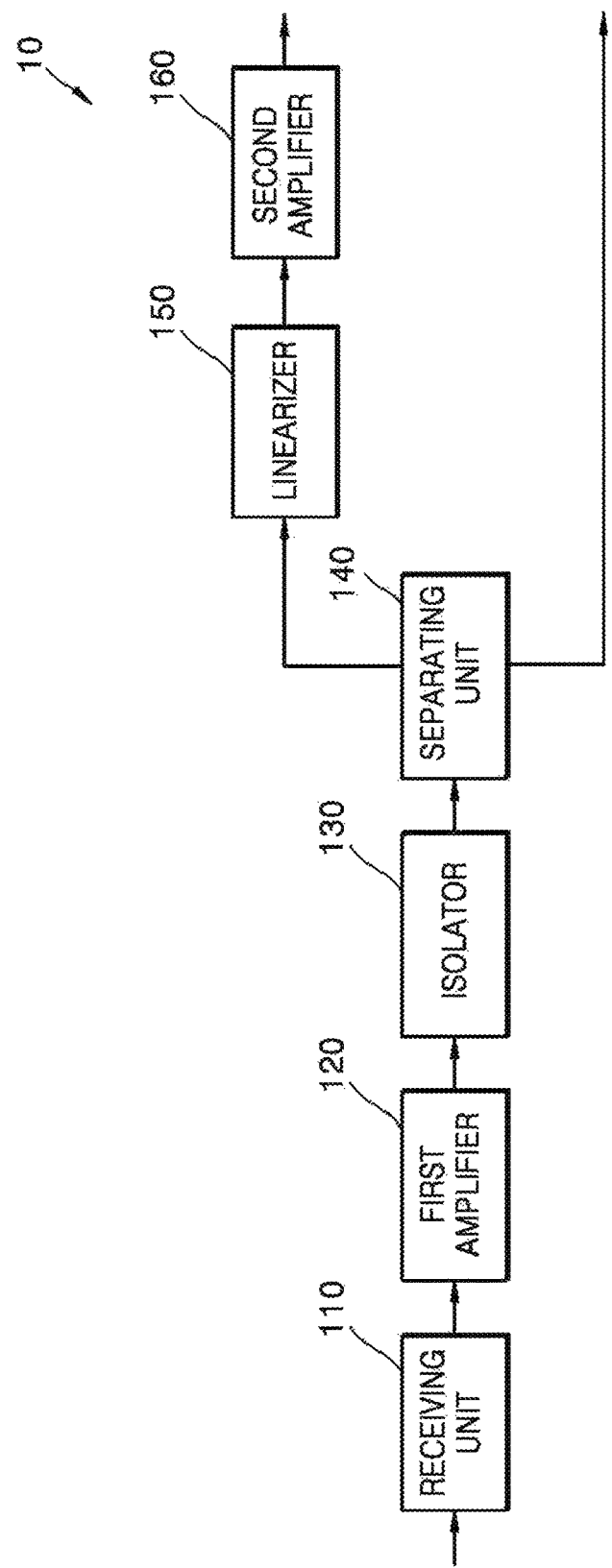
FIG. 1 is a schematic block diagram of the partial structure of an amplification device according to an embodiment of the inventive concept.

FIG. 1 is a schematic block diagram of the partial structure of an amplification device according to an embodiment of the inventive concept. An amplification device 10 shown in FIG. 1 may be implemented as an amplification device or module embedded in an apparatus (e.g., a headend unit which amplifies and transmits a terminal signal to a base station or a remote unit which amplifies and transmits a base station signal to a terminal) constituting a node of a distributed antenna system but is not limited thereto. The amplification device 10 may be applied to any device which receives and amplifies a multi-band signal before outputting the multi-band signal. Hereinafter, a case where the amplification device 10 is included in a unit constituting a node of a distributed antenna system will be described as an example.

Referring to FIG. 1, the amplification device 10 may include a receiving unit 110, a first amplifier 120, an isolator 130, a separating unit 140, a linearizer 150, and a second amplifier 160.

The receiving unit 110 may receive a raw multi-band signal. The receiving unit 110 may receive the raw multi-band signal from a base station, a user terminal, or an apparatus constituting a node of a distributed antenna system. The raw multi-band signal may include at least two raw band signals. For convenience's sake in the description, hereinafter, a case where the raw multi-band signal includes a first raw band signal in a relatively lower frequency band and a second raw band signal in a relatively higher frequency band will be explained as an example (which also applies to the description of FIGS. 2 through 7).

The receiving unit 110 may performs predetermined signal processing, e.g., attenuation, on the raw multi-band signal to output a multi-band signal. The multi-band signal may include a first band signal obtained by performing predetermined signal processing on the first raw band signal and a second band signal obtained by performing predetermined signal processing on the second raw band signal. The receiving unit 110 will be described in detail with reference to FIG. 2 later.

Unlike the embodiment illustrated in FIG. 1, the receiving unit 110 may be omitted in other embodiments. At this time, the raw multi-band signal may be directly input to the first amplifier 120 as a multi-band signal.

The first amplifier 120 may amplify the multi-band signal received from the receiving unit 110 to a first level. The first amplifier 120 may have a first gain. The first gain and the first level may be set according to an output condition for the first band signal. Alternatively, the first gain and the first level may be set, taking account of a power ratio of a power divider (141B in FIG. 3) as well as an output condition for the first band signal.

The first amplifier 120 may be formed of a transistor, e.g., a gallium nitride (GaN) transistor, with broadband characteristics.

The isolator 130 may enable signal transmission from the first amplifier 120 to the separating unit 140 and disable signal transmission from the separating unit 140 to the first amplifier 120, thereby preventing a noise component from being included in the multi-band signal which has been amplified to the first level.

The separating unit 140 may separate the multi-band signal, which has been amplified to the first level, by frequency bands. For example, the separating unit 140 may separate the multi-band signal which has been amplified to the first level into a first band signal having the first level and a second band signal having the first level and output the first band signal and the second band signal. The first band signal may be output without being subjected to additional signal processing such as amplification. The second band signal may be subjected to predetermined signal processing in the linearizer 150 and the second amplifier 160 before being output, which will be described later.

The linearizer 150 may distort the second band signal, taking account of the nonlinearity of the second amplifier 160. Accordingly, the linearity of the second amplifier 160 may be improved and the quality of an output signal may also be improved. Alternatively, the linearizer 150 may be omitted.

The second amplifier 160 may amplify the second band signal to a second level. The second amplifier 160 may have a second gain. The second gain and the second level may be set according to an output condition for the second band signal. Since the second band signal has already been amplified to the first level by the first amplifier 120, the second gain may be set, further taking account of the degree of amplification performed by the first amplifier 120. The second gain may be set, further taking account of a power ratio of a power divider (141B in FIG. 3).

The second amplifier 160 may be formed of a laterally diffused metal oxide semiconductor (LDMOS) transistor corresponding to the second band signal.

According to an embodiment of the inventive concept, the amplification device 10 amplifies a high-frequency band signal requiring high power amplification and a low-frequency band signal to a low-power level required for the low-frequency band signal and then additionally amplifies only the high-frequency band signal so that the high-frequency band signal has a high-power level eventually required for a service.

Consequently, the amplification device 10 uses low-gain amplifiers instead of large, expensive high-gain amplifiers to amplify a band requiring high power, so that the volume and manufacturing cost of the amplification device 10 may be decreased. In addition, the amplification device 10 may be efficiently designed, managed and operated due to unified amplification for each frequency band.

Figure 2:
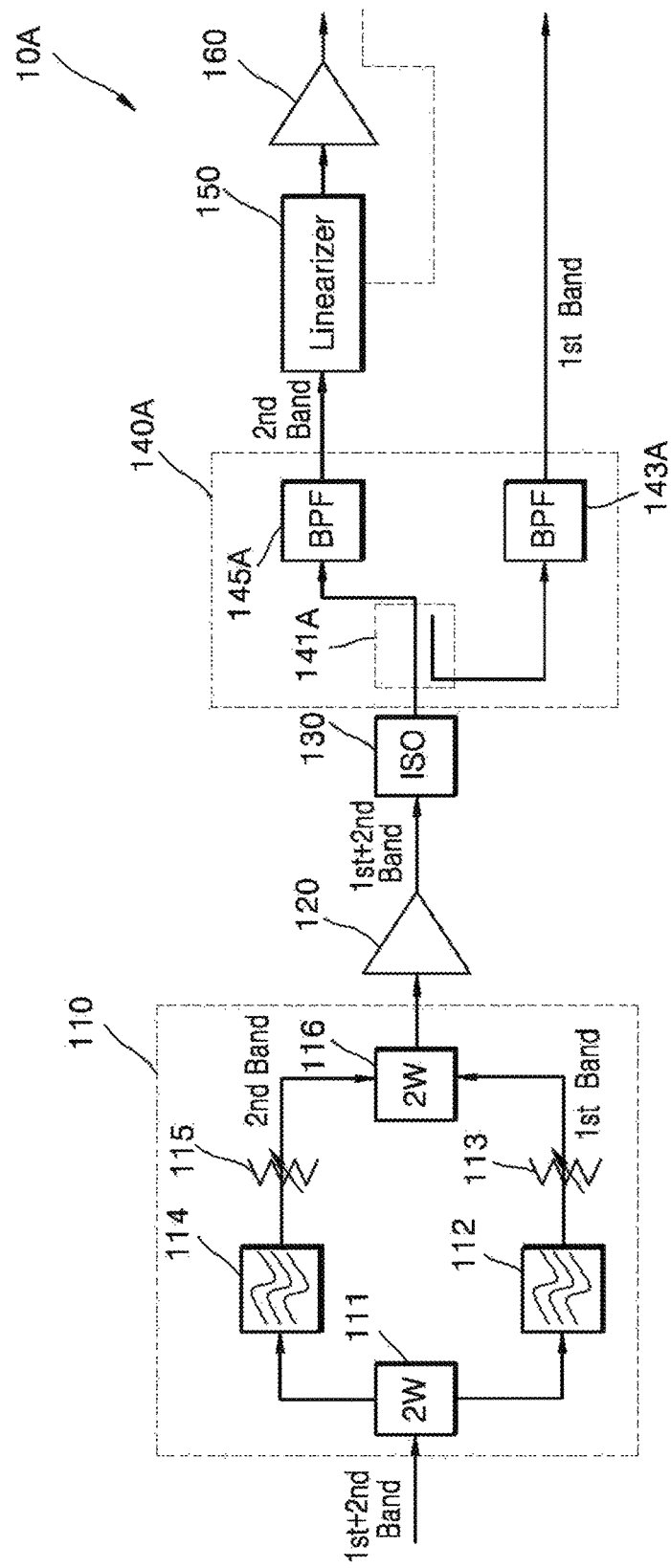
FIG. 2 is a detailed diagram of an example of the amplification device shown in FIG. 1.

FIG. 2 is a detailed diagram of an example of the amplification device shown in FIG. 1. Like reference numerals in FIGS. 1 and 2 denote like elements, and thus their description will be omitted. Description will be focused on the receiving unit 110 and a separating unit 140A illustrated in detail in FIG. 2.

Referring to FIGS. 1 and 2, the receiving unit 110 in an amplification device 10A may include a splitter (or 2W) 111, a first receiver filter 112, a second receiver filter 114, attenuators 113 and 115, and a combiner (or 2W) 116.

The splitter 111 may receive and split a raw multi-band signal into a first raw multi-band split signal and a second raw multi-band split signal.

The first receiver filter 112 may filter the first raw multi-band split signal to output a first raw band signal. The attenuator 113 may attenuate the first raw band signal from the first receiver filter 112 to output an attenuated first raw band signal.

The second receiver filter 114 may filter the second raw multi-band split signal to output a second raw band signal. The attenuator 115 may attenuate the second raw band signal from the second receiver filter 114 to output an attenuated second raw band signal.

The combiner 116 may combine the attenuated first raw band signal and the attenuated second raw band signal to generate a multi-band signal and may output the multi-band signal to the first amplifier 120.

The receiving unit 110 removes noise from a raw multi-band signal received from a base station, a user terminal or the like and adjusts the amplitude of the raw multi-band signal, so that a signal-to-noise ratio (SNR) of final output signals may be improved.

As shown in FIG. 2, the separating unit 140A in the amplification device 10A may include a coupler 141A, a first filter 143A, and a second filter 145A.

The coupler 141A may split the multi-band signal, which has been amplified to the first level, into a first multi-band split signal and a second multi-band split signal.

The first filter 143A may filter the first multi-band split signal to output a first band signal. The first filter 143A may be formed of, for example, a low pass filter (LPF) or a band pass filter (BPF).

The second filter 145A may filter the second multi-band split signal to output a second band signal. The second filter 145A may be formed of, for example, a high pass filter (HPF) or a BPF. Alternatively, the first and second filters 143A and 145A may be omitted, which will be described in detail with reference to FIG. 6 later.

Figure 3:
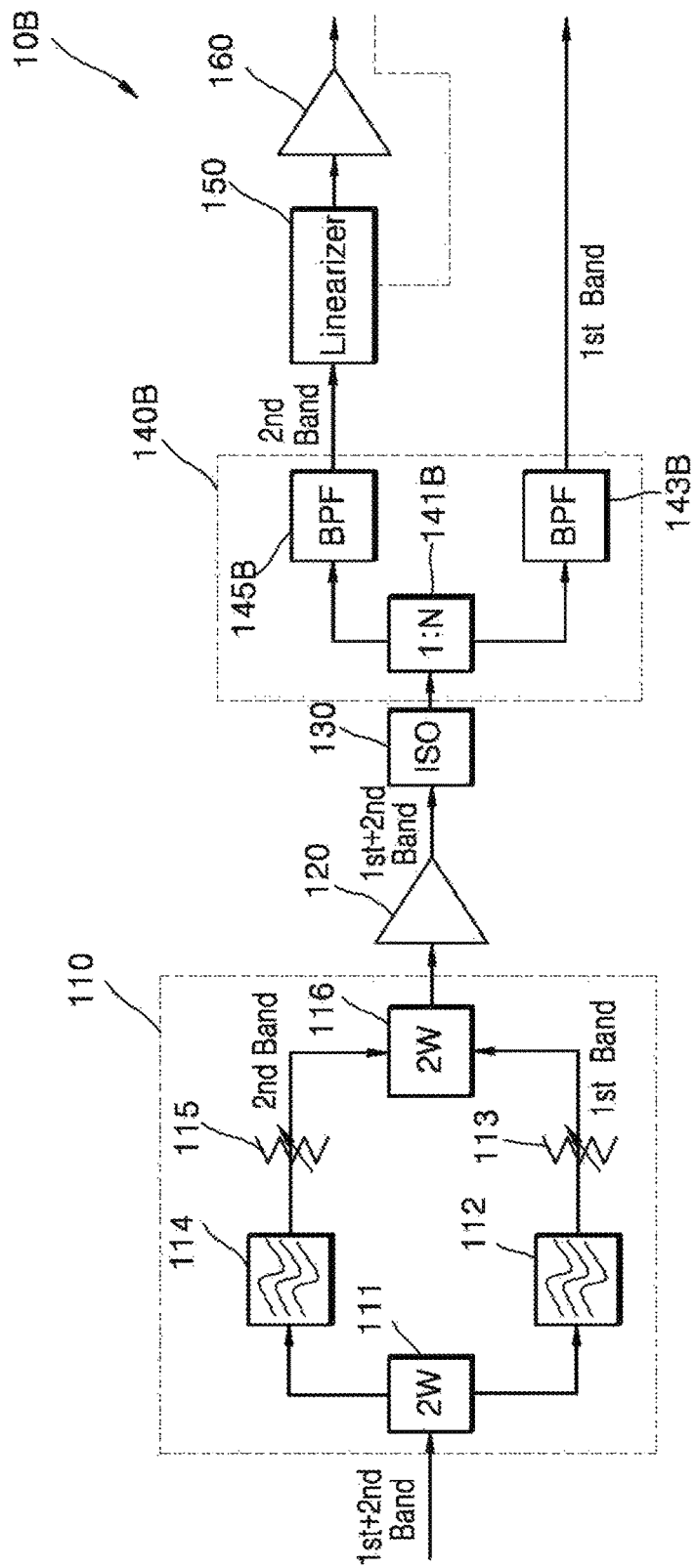
FIG. 3 is a detailed diagram of another example of the amplification device shown in FIG. 1.

FIG. 3 is a detailed diagram of another example of the amplification device shown in FIG. 1. Like reference numerals in FIGS. 1 through 3 denote like elements, and thus their description will be omitted. Description will be focused on a separating unit 140B illustrated in detail in FIG. 3.

Referring to FIGS. 1 through 3, the separating unit 140B in an amplification device 10B may include a power divider 141B, a first filter 143B, and a second filter 145B.

The power divider 141B may split the multi-band signal, which has been amplified to the first level, into a first multi-band split signal having a third level and a second multi-band split signal having a fourth level according to a predetermined power ratio.

The first filter 143B may filter the first multi-band split signal to output a first band signal. The first filter 143B may be formed of, for example, a LPF or a BPF.

The second filter 145B may filter the second multi-band split signal to output a second band signal. The second filter 145B may be formed of, for example, an HPF or a BPF.

In the amplification device 10B shown in FIG. 3, the power divider 141B splits the multi-band signal into the first multi-band split signal and the second multi-band split signal according to the predetermined power ratio, and therefore, the first gain of the first amplifier 120 and the second gain of the second amplifier 160 need to be set, taking account of the predetermined power ratio of the power divider 141B besides the output condition for the first band signal corresponding to the first gain and the output condition for the second band signal corresponding to the second gain.

For example, taking account of the predetermined power ratio of the power divider 141B, the first gain of the first amplifier 120 may be set to a value greater than a value set when the multi-band signal is directly amplified to a level corresponding to the output condition for the first band signal in the amplification device 10A shown in FIG. 2. Accordingly, in the amplification device 10B shown in FIG. 3, not the first level of the multi-band signal which has been amplified by the first amplifier 120 with the first gain but the third level of the first multi-band split signal may correspond to the output condition for the first band signal.

Taking account of the predetermined power ratio of the power divider 141B, the second gain of the second amplifier 160 may be set to a value greater than a value set when the second band signal is directly amplified to a level corresponding to the output condition for the second band signal in the amplification device 10A shown in FIG. 2.

Like the first and second filters 143A and 145A in the amplification device 10A, the first and second filters 143B and 145B in the amplification device 10B may be omitted in another embodiment, which will be described in detail with reference to FIG. 7 later.

Figure 4:
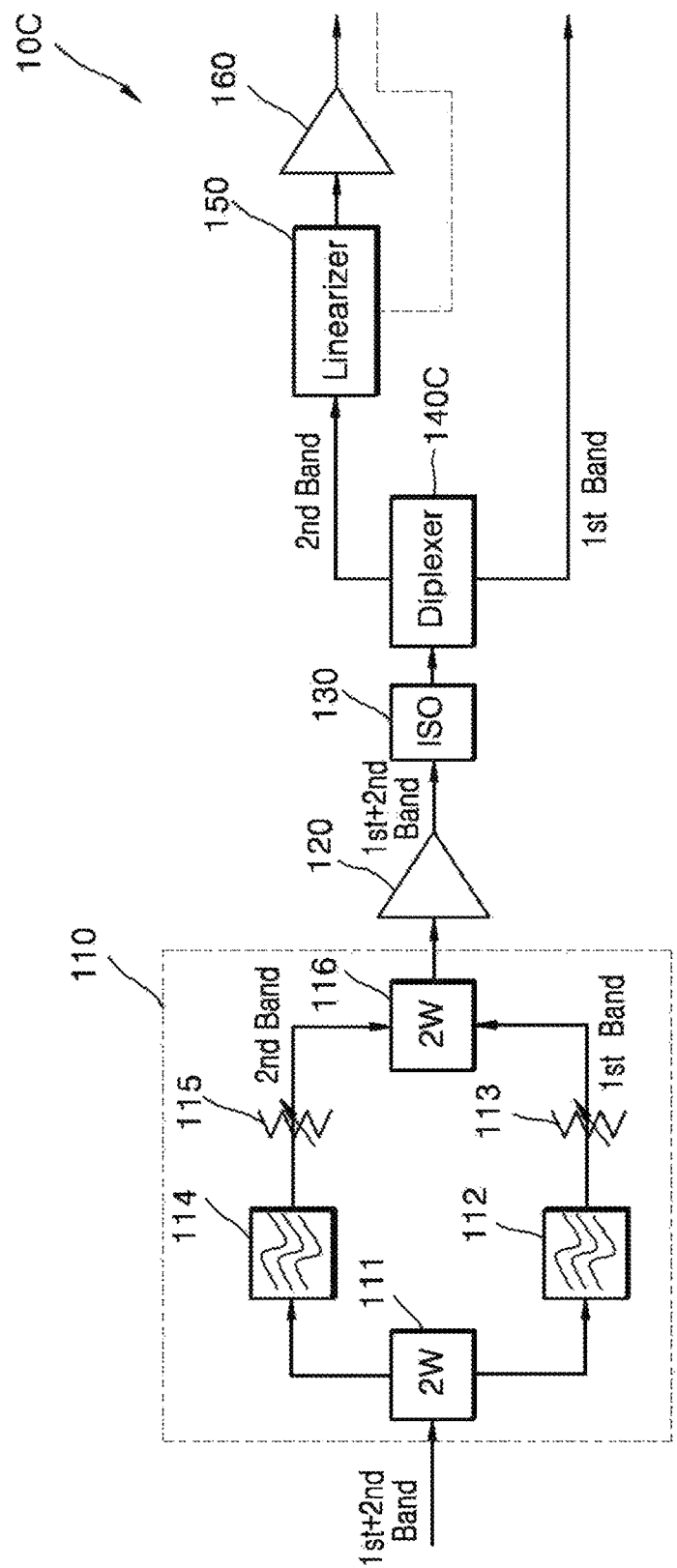
FIG. 4 is a detailed diagram of still another example of the amplification device shown in FIG. 1.

FIG. 4 is a detailed diagram of still another example of the amplification device shown in FIG. 1. Like reference numerals in FIGS. 1 through 4 denote like elements, and thus their description will be omitted. Description will be focused on a separating unit 140C shown in FIG. 4.

Referring to FIGS. 1 through 4, the separating unit 140C in an amplification device 10C may be formed of a diplexer.

The diplexer separates a signal into two signals in different bands using a LPF and an HPF. Accordingly, the diplexer may separate the multi-band signal, which has been amplified to the first level, into a first band signal and a second band signal without the first filter 143A or 143B and the second filter 145A or 145B shown in FIG. 2 or FIG. 3.

Figure 5:
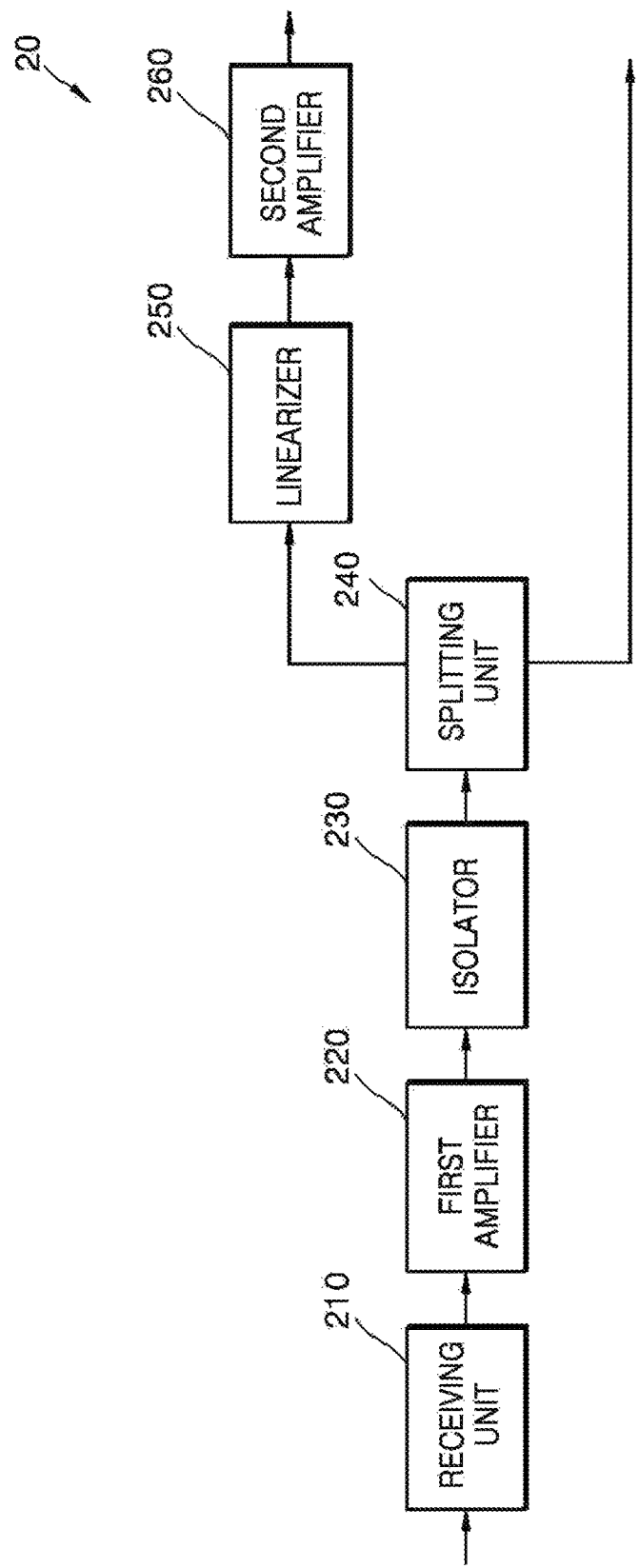
FIG. 5 is a schematic block diagram of the partial structure of an amplification device according to another embodiment of the inventive concept.

FIG. 5 is a schematic block diagram of the partial structure of an amplification device according to another embodiment of the inventive concept. Like the amplification device 10 shown in FIG. 1, an amplification device 20 shown in FIG. 5 may be implemented as an amplification device or module embedded in an apparatus constituting a node of a distributed antenna system but is not limited thereto. Like reference numerals in FIGS. 1 and 5 denote like elements, and thus their description will be omitted. Description will be focused on a splitting unit 240 shown in FIG. 5.

Referring to FIGS. 1 and 5, the amplification device 20 may include the splitting unit 240 instead of the separating unit 140 of the amplification device 10.

The splitting unit 240 may split the multi-band signal, which has been amplified to the first level in a first amplifier 220, into a plurality of split signals. For example, the splitting unit 240 may split the multi-band signal including the first and second band signals into a first multi-band split signal including the first and second band signals and a second multi-band split signal including the first and second band signals.

The splitting unit 240 may transmit the first and second multi-band split signals to different paths. The first multi-band split signal may be output from the amplification device 20 without being subjected to additional signal processing such as amplification. The second multi-band split signal may be output from the amplification device 20 after being subjected to predetermined signal processing in a linearizer 250 and a second amplifier 260.

As described above, unlike the separating unit 140 shown in FIG. 1, the splitting unit 240 does not separate a multi-band signal by frequency bands but splits the multi-band signal into a plurality of signals including all bands of the multi-band signal.

The splitting unit 240 is included in the amplification device 20 for a case where the amplification device 20 is embedded in a remote unit or the like of a distributed antenna system. In other words, the fact considered is that when the first and second multi-band split signals are combined by a duplexer (not shown) at an output terminal of the remote unit and then transmitted to a user terminal, a signal in any band other than a predetermined band is filtered out by the duplexer.

Figure 6:
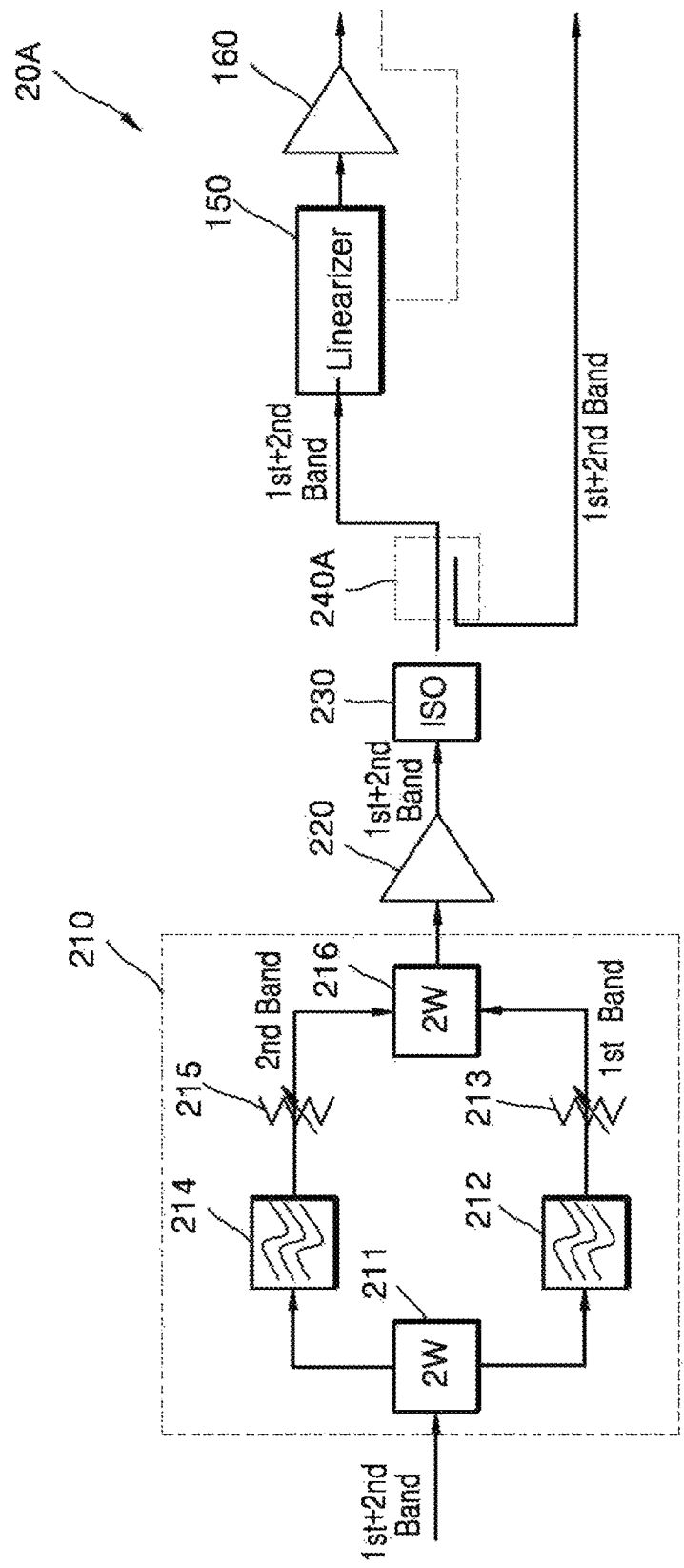
FIG. 6 is a detailed diagram of an example of the amplification device shown in FIG. 5.

FIG. 6 is a detailed diagram of an example of the amplification device shown in FIG. 5. FIG. 7 is a detailed diagram of another example of the amplification device shown in FIG. 5. Like reference numerals in FIGS. 5 through 7 denote like elements, and thus their description will be omitted. Description will be focused on splitting units 240A and 240B shown in FIGS. 6 and 7.

Referring to FIGS. 5 and 6, the splitting unit 240A in an amplification device 20A may be formed of a single coupler. The splitting unit 240A may split the multi-band signal, which has been amplified to the first level, into a first multi-band split signal including a first band signal and a second band signal and a second multi-band split signal including the first and second band signals.

Figure 7:
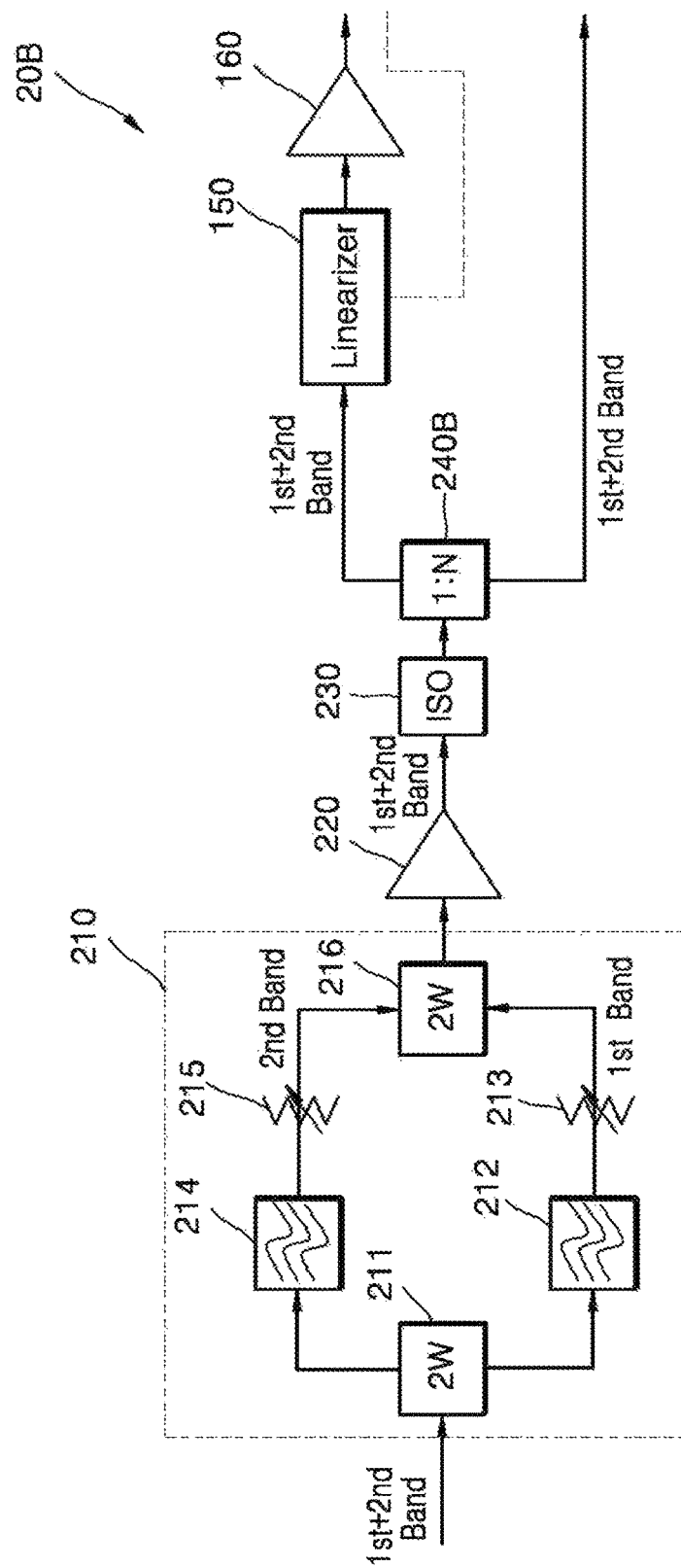
FIG. 7 is a detailed diagram of another example of the amplification device shown in FIG. 5.

Referring to FIGS. 5 and 7, the splitting unit 240B in an amplification device 20B may be formed of a single power divider. The splitting unit 240B may split the multi-band signal, which has been amplified to the first level, into a first multi-band split signal which has a third level and includes a first band signal and a second band signal and a second multi-band split signal which has a fourth level and includes the first and second band signals, according to a predetermined power ratio.

The splitting units 240A and 240B in the respective amplification devices 20A and 20B may have a structure in which filters for filtering out a predetermined band signal from a multi-band split signal are omitted, so that the amplification devices 20A and 20B enable an increase of a convenience in design and a decrease of manufacturing cost.

While the inventive concept has been particularly shown and described with reference to embodiments thereof, it will be understood that various changes in form and details may be made therein without departing from the scope of the following claims.

The invention claimed is:

1. An amplification device comprising:
   a first amplifier configured to amplify a multi-band signal to a first level;
   a separating unit configured to separate the multi-band signal having the first level into a first band signal and a second band signal;
   a second amplifier configured to amplify the second band signal to a second level; and
   an isolator configured to be located between the first amplifier and the separating unit to block an inflow of a signal from the separating unit to the first amplifier.

2. The amplification device of claim 1, wherein the first level is set according to an output condition for the first band signal and the second level is set according to an output condition for the second band signal.

3. The amplification device of claim 1, wherein the separating unit comprises:
   a coupler configured to split the multi-band signal having the first level into a first multi-band split signal and a second multi-band split signal;
   a first filter configured to filter the first multi-band split signal to output the first band signal; and
   a second filter configured to filter the second multi-band split signal to output the second band signal.

4. The amplification device of claim 1, wherein the separating unit comprises:
   a power divider configured to split the multi-band signal having the first level into a first multi-band split signal having a third level and a second multi-band split signal having a fourth level;

a first filter configured to filter the first multi-band split signal having the third level to output the first band signal; and a second filter configured to filter the second multi-band split signal having the fourth level to output the second band signal.

5. The amplification device of claim 4, wherein the third level is set according to an output condition for the first band signal.

6. The amplification device of claim 1, wherein the separating unit comprises a diplexer configured to separate the multi-band signal having the first level into the first band signal and the second band signal.

7. The amplification device of claim 1, further comprising a receiving unit configured to receive a raw multi-band signal and to output the multi-band signal,
wherein the receiving unit divides the raw multi-band signal into a first raw band signal and a second raw band signal, attenuates the first and second raw band signals, and combines attenuated first and second raw band signals to output the multi-band signal.

8. The amplification device of claim 1, further comprising a linearizer configured to linearize the second band signal,
wherein the second amplifier amplifies, to the second level, the second band signal that has been linearized by the linearizer.

9. The amplification device of claim 1, wherein the first band signal is in a lower frequency band than the second band signal.

10. The amplification device of claim 1, wherein the first level is lower than the second level.

11. An amplification device comprising:
a first amplifier configured to amplify a multi-band signal to a first level;
a splitting unit configured to split the multi-band signal having the first level into a first multi-band split signal and a second multi-band split signal;
a second amplifier configured to amplify the second multi-band split signal to a second level; and
an isolator configured to be located between the first amplifier and the splitting unit to block an inflow of a signal from the splitting unit to the first amplifier.

12. The amplification device of claim 11, wherein the first level is set according to an output condition for a first band signal comprised in the first multi-band split signal and the second level is set according to an output condition for a second band signal comprised in the second multi-band split signal.

13. The amplification device of claim 11, wherein the splitting unit comprises a coupler configured to split the multi-band signal having the first level into the first multi-band split signal and the second multi-band split signal.

14. The amplification device of claim 11, wherein the splitting unit comprises a power divider configured to split the multi-band signal having the first level into the first multi-band split signal and the second multi-band split signal so that the first multi-band split signal has a third level and the second multi-band split signal has a fourth level.

15. The amplification device of claim 14, wherein the third level is set according to an output condition for a first band signal comprised in the first multi-band split signal.

* * * * *